(12) United States Patent
Van Acht et al.

(10) Patent No.: US 7,671,660 B2
(45) Date of Patent: Mar. 2, 2010

(54) SINGLE THRESHOLD AND SINGLE CONDUCTIVITY TYPE LOGIC

(75) Inventors: Victor Martinus Gerardus Van Acht, Waalre (NL); Nicolaas Lambert, Waalre (NL); Andrei Mijiritskii, Zaltbommel (NL); Pierre Hermanus Woerlee, Valkenswaard (NL)

(73) Assignee: NXP B.V., Eindhoven (NL)

( * ) Notice: Subject to any disclaimer, the term of this patent is extended or adjusted under 35 U.S.C. 154(b) by 13 days.

(21) Appl. No.: 12/067,075

(22) PCT Filed: Sep. 14, 2006

(86) PCT No.: PCT/IB2006/053281
§ 371 (c)(1),
(2), (4) Date: Mar. 20, 2008

(87) PCT Pub. No.: WO2007/034384
PCT Pub. Date: Mar. 29, 2007

(65) Prior Publication Data
US 2008/0258770 A1    Oct. 23, 2008

(30) Foreign Application Priority Data
Sep. 20, 2005    (EP) .................................. 05108653

(51) Int. Cl.
*H03K 17/16* (2006.01)
(52) U.S. Cl. .................. 327/390; 327/389; 327/427; 327/589; 326/88
(58) Field of Classification Search .................. 326/88, 326/92; 327/390, 389, 427, 589
See application file for complete search history.

(56) References Cited

U.S. PATENT DOCUMENTS

| 3,774,055 | A  |   | 11/1973 | Bapat |
| 5,512,845 | A  | * | 4/1996  | Yuh ............................. 326/88 |
| 5,594,380 | A  | * | 1/1997  | Nam ........................... 327/390 |
| 6,215,329 | B1 | * | 4/2001  | Campardo et al. ............ 326/88 |

(Continued)

FOREIGN PATENT DOCUMENTS

GB    2078459 A    1/1982

(Continued)

OTHER PUBLICATIONS

IBM Technical Disclosure Bulletin, Dec. 1974. NN74121989 (p. No. 1989-1990).*

*Primary Examiner*—Vibol Tan

(57) ABSTRACT

A logic assembly (400) is composed from circuit elements of a single threshold and single conductivity type and comprises a logic circuitry (410) having at least a set of switches each having a main current path and a control terminal. The main current path forms a series arrangement having first and second conducting terminals coupled to power supply lines. The main current paths being coupled to a common node that forms an output of logic assembly (400). The control terminals of said switches being coupled to clock circuitry for providing mutually non-overlapping clock signals to said control terminal. The logic assembly further comprises an output boosting circuit (420) for boosting the output of said logic assembly (400) including a capacitive means (421) for enabling supply of additional charge to the output of said logic assembly (400). It further includes a bootstrapping circuit (422) for enabling an additional supply of charge to a first end of said capacitive means, resulting in a boosted voltage at a second end of said capacitive means.

8 Claims, 16 Drawing Sheets

U.S. PATENT DOCUMENTS

| | | | |
|---|---|---|---|
| 2003/0016070 A1* | 1/2003 | Yang | 327/390 |
| 2004/0216015 A1 | 10/2004 | Bernstein et al. | |
| 2005/0194994 A1* | 9/2005 | Dubey | 326/88 |
| 2008/0309400 A1* | 12/2008 | van der Wagt | 327/551 |

FOREIGN PATENT DOCUMENTS

| | | |
|---|---|---|
| WO | 8102080 A1 | 7/1981 |

* cited by examiner

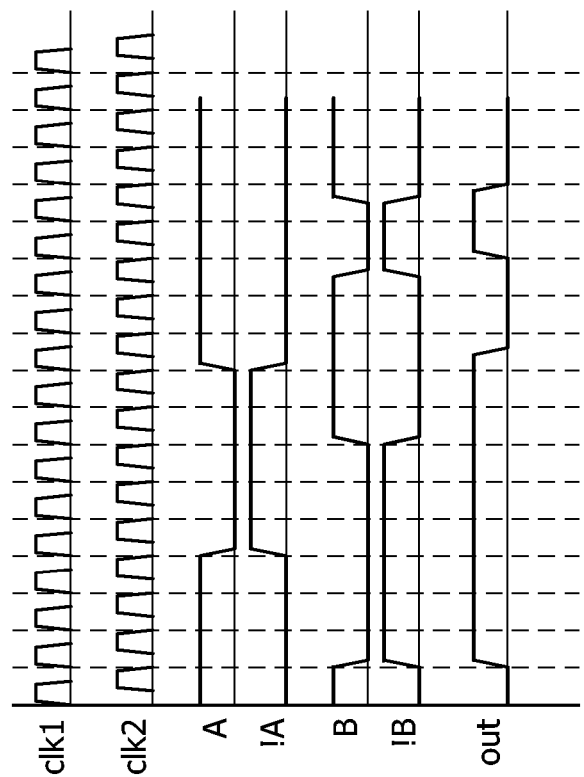
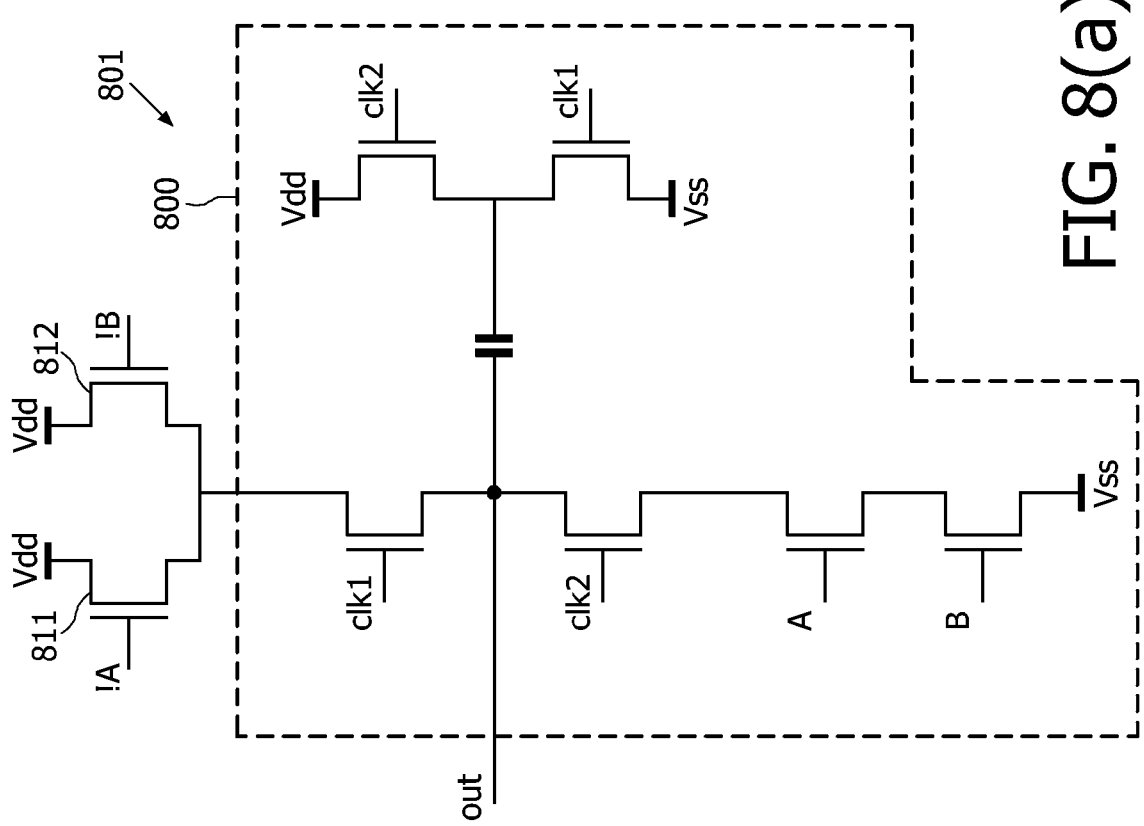
FIG. 8(a)
FIG. 8(b)

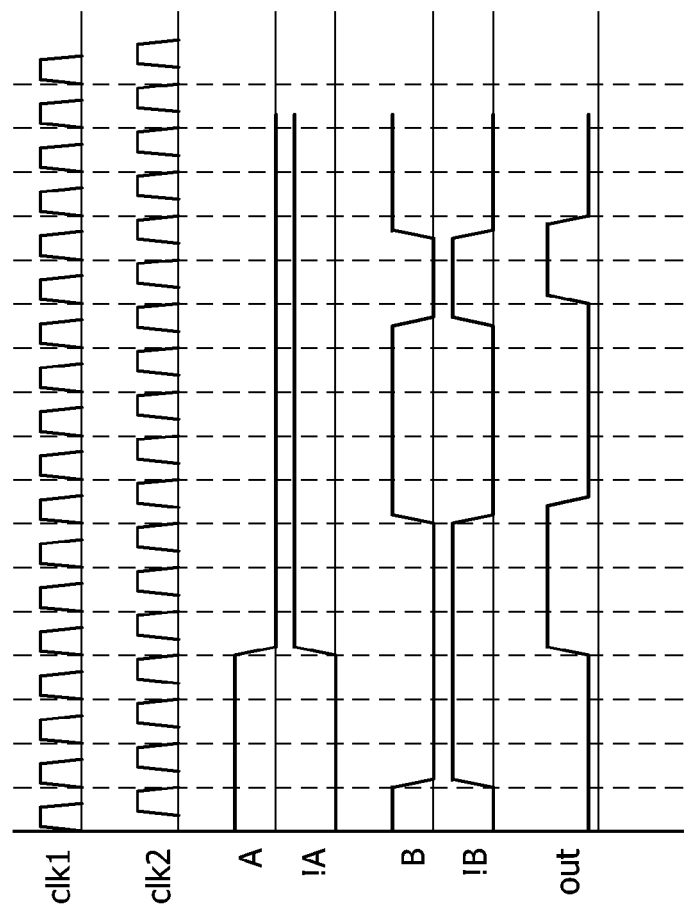
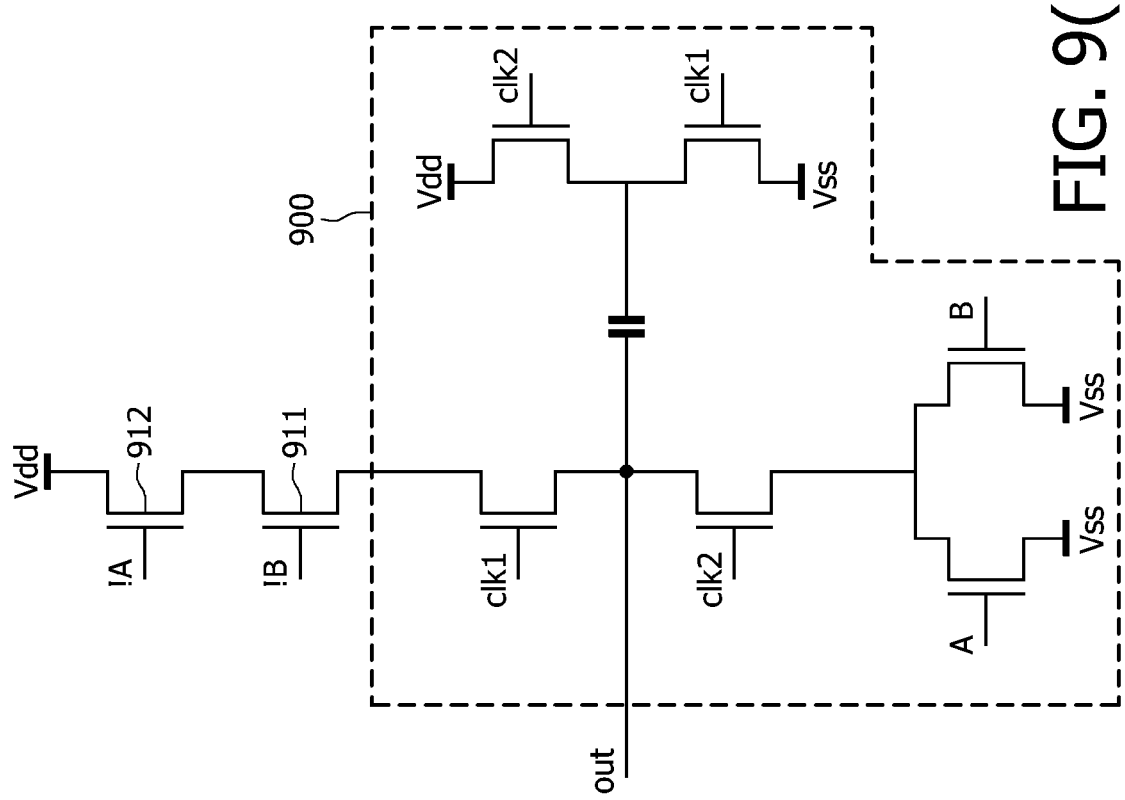
FIG. 9(a)
FIG. 9(b)

SINGLE THRESHOLD AND SINGLE CONDUCTIVITY TYPE LOGIC

The invention relates to a logic assembly, more particularly, the invention relates to a logic assembly having single threshold and single conductivity type circuit elements.

Figure 1:
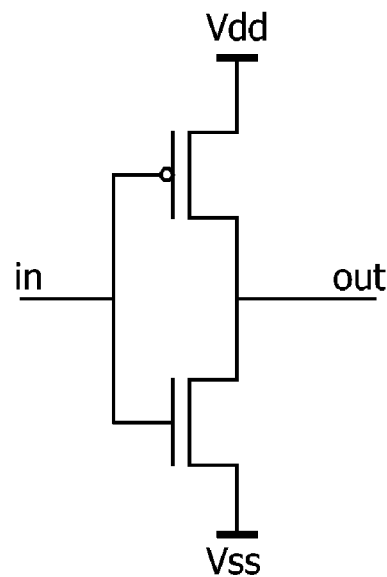

Complementary Metal Oxide Semiconductor (CMOS) logic circuits are popularly used for realizing logic blocks because of their many advantages, for example, high input impedance, low output impedance, negligible static power consumption and rail-to-rail output swing. FIG. 1 shows an inverter logic structure using conventional CMOS technology. As shown in FIG. 1 and as the name suggest, CMOS logic circuits use both N-conductivity (NMOS) as well as P-conductivity (PMOS) transistors. In many applications, it is desirable to apply only transistors of a single conductivity type in logic circuits e.g. polymer or plastic electronics, and hard disk-like solid-state memory applications.

Figure 2:
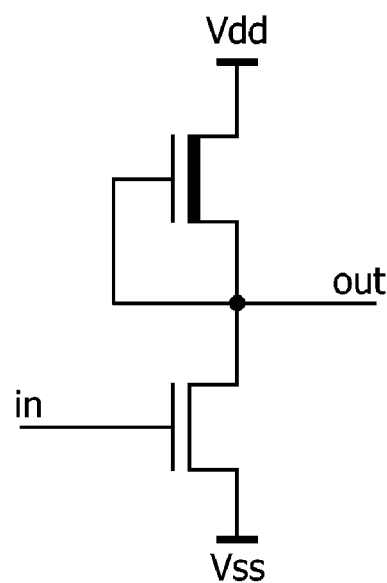

Single conductivity type logic circuits are advantageous with respect to the production/manufacturing costs of chips by reducing number of mask count and lithographic processes during manufacturing. Typically single conductivity type logic uses a depletion transistor as load device. A single conductivity type logic inverter using a depletion transistor is shown in FIG. 2. In this example, the single conductivity type logic inverter is realized by replacing a PMOS transistor of conventional CMOS with a depletion NMOS-transistor having a negative threshold voltage. The gate of depletion transistor is connected to its source, this makes the transistor act as a current source. Characteristics of this type of NMOS-only logic circuits are strongly dependent on the transistors sizing. Furthermore the circuit shown in FIG. 2 does not offer a rail-to-rail output. In addition this circuits has high static power dissipation. In addition the circuits may still not offer manufacturing cost advantages as fabricating depletion or enhancement transistors on chip requires a higher number of masking and lithographic processes.

Figure 3:
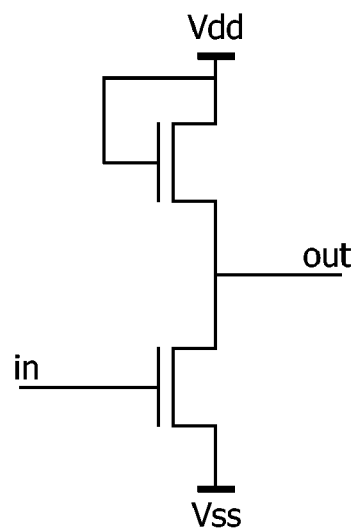

Replacing a depletion/enhancement transistor by a transistor connected in a diode mode, as shown in FIG. 3, may solve problems relating to depletion/enhancement manufacturing cost. The diode-connected transistor may have the same threshold as its normal counterpart and therefore providing a single threshold, single conductivity type logic. The diode connected transistor allows to have a transistors having similar characteristics fabricated on the chip for realizing a single threshold and single conductivity type of logic circuits, and therefore reducing the number of masking steps in manufacturing process and hence reducing the cost.

With this circuit, rail-to-rail output still remains a problem. As apparent from the FIG. 3, the output of the inverter will reach a maximum value of $V_{dd}-V_T$ where $V_T$ is the threshold voltage of the transistor. According normal industry standards and technical requirements threshold voltage is roughly chosen about ¼ of $V_{dd}$. Threshold voltage is required approximately ¼ of $V_{dd}$ to minimize sub-threshold leakage currents when the transistor is switched off. This means that the maximum value at which the output can reach is only around ¾ $V_{dd}$, which is not enough to fully open a transistor in a next logic gate coupled to the output of FIG. 3. The relatively small output range limits the cascading of this type of circuits, which is a major disadvantage.

Thus, there is a need of a single threshold and single conductivity type logic, which offers a reduced power dissipation and rail-to-rail output.

Amongst other, it is an object of the invention to provide a single threshold and single conductivity type logic, which offers a reduced power dissipation and rail-to-rail output.

To this end this invention provides a logic assembly composed from circuit elements of a single threshold and single conductivity type, comprising;

a logic circuit having at least a set of switches each having a main current path and a control terminal, said main current paths forming a series arrangement having first and second conducting terminals coupled to power supply lines, said main current paths being coupled to a common node that forms an output of the logic assembly 400 and control terminals of said switches being coupled to clock circuitry for providing mutually non-overlapping clock signals to said control terminals, and;

an output boosting circuit for boosting the output of said logic assembly 400 comprising a capacitive means for enabling supply of an additional charge to the output of said logic assembly and, a bootstrapping circuit for enabling an additional supply of charge to a first end of said capacitive means, resulting in a boosted voltage at a second end of said capacitive means.

This aspect of the invention enables a rail-to-rail output in a logic assembly that uses only single threshold and single conductivity type logic elements. This circuit uses capacitive means for boosting the output to achieve a rail-to-rail output. Further a bootstrapping circuit is provided with this circuit for ensuring the capacitor is charged/discharged for enabling supply of an additional charge for boosting output of the logic assembly. Using single conductivity and single threshold type elements, reduces the number of masking steps, and therewith the manufacturing cost of the logic assembly.

According to yet another aspect the output boosting circuit is coupled to one of the control terminals of the set of switches of said logic circuit. In that embodiment the output boosting circuit allows for a boosting of the output by controlling logic elements to supply sufficient charge to provide a high voltage output. According to yet another aspect the output boosting circuit is coupled to the output of said logic circuit. In that embodiment the output-boosting circuit allows boosting of the output directly through the capacitive means. Also according to yet still another aspect at least one of said first and second conducting terminals of said set of switches is coupled directly to power supply lines for providing a logic gate. According to a further aspect one or both of said first and second conducting terminals of said set of switches are coupled to power supply lines through one or more logic elements for providing a logic circuit. This aspect provides design flexibility and options to choose and design according to the particular application or according to the desired accuracy.

According to yet a further aspect said switches may be any switches including transistors. According to yet still a further aspect synchronization architecture is provided for cascading a plurality of logic assemblies. This aspect enables construction of a complex cascaded logic. The logic may be a shift register, counter or any other cascaded logic.

Figure 7:
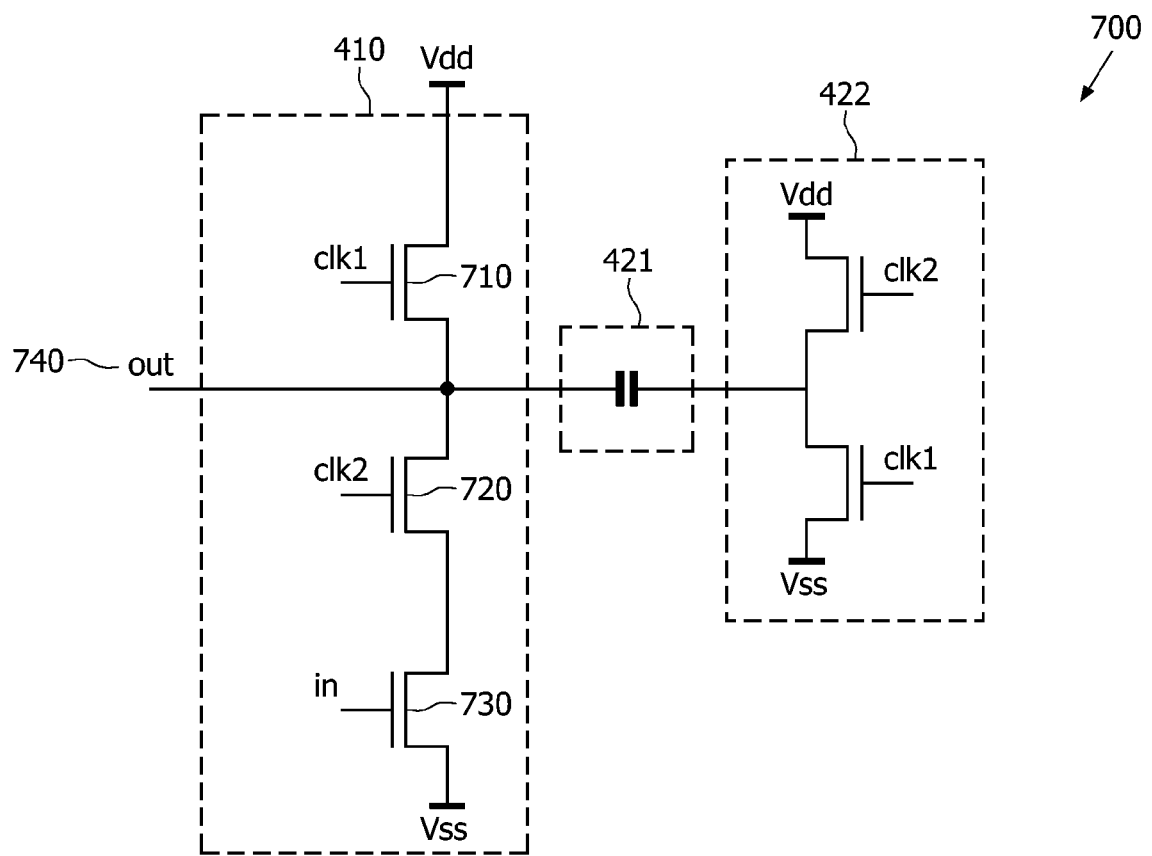
Figure 7A:
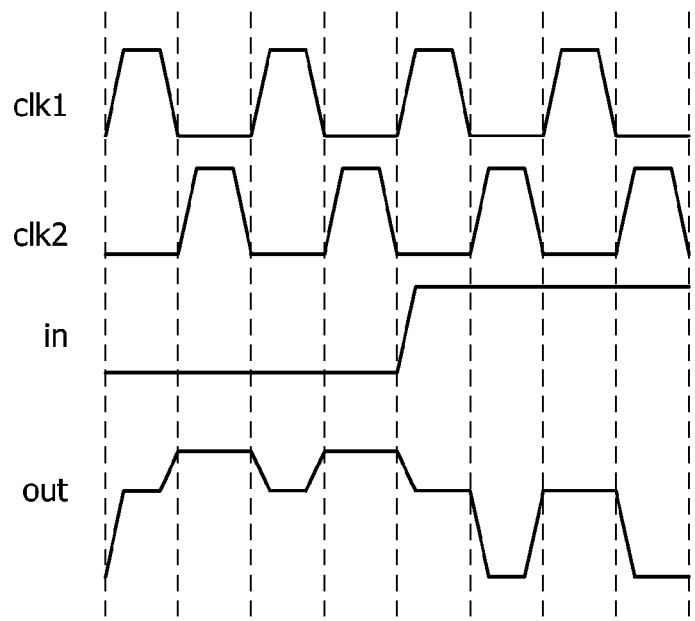
Figure 7B:
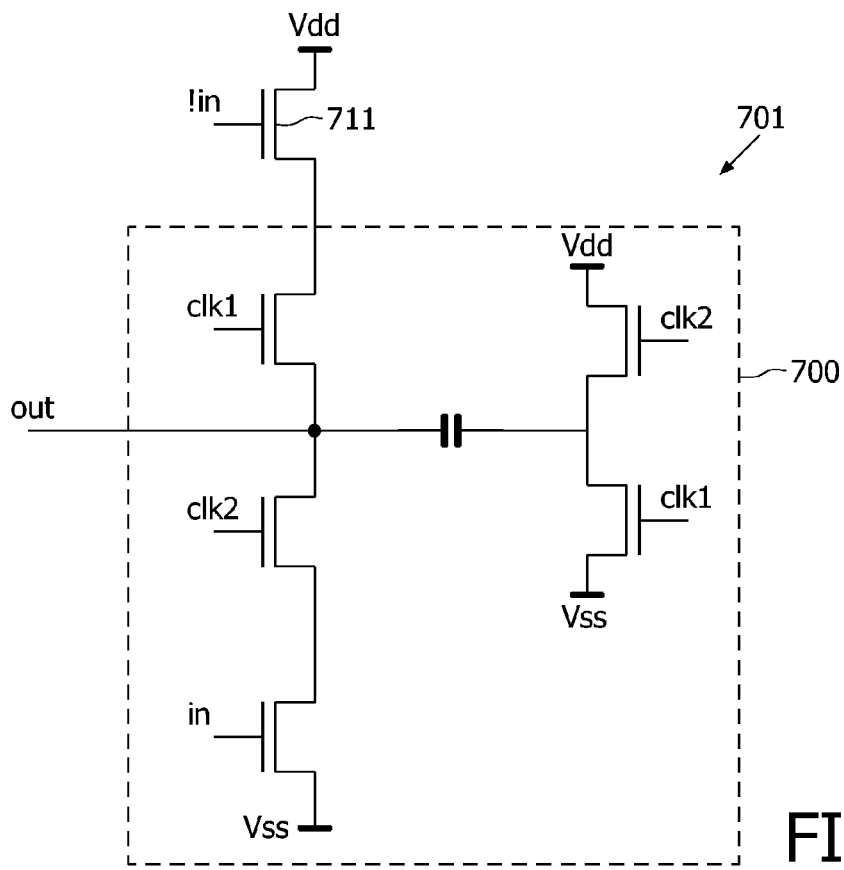
Figure 7C:
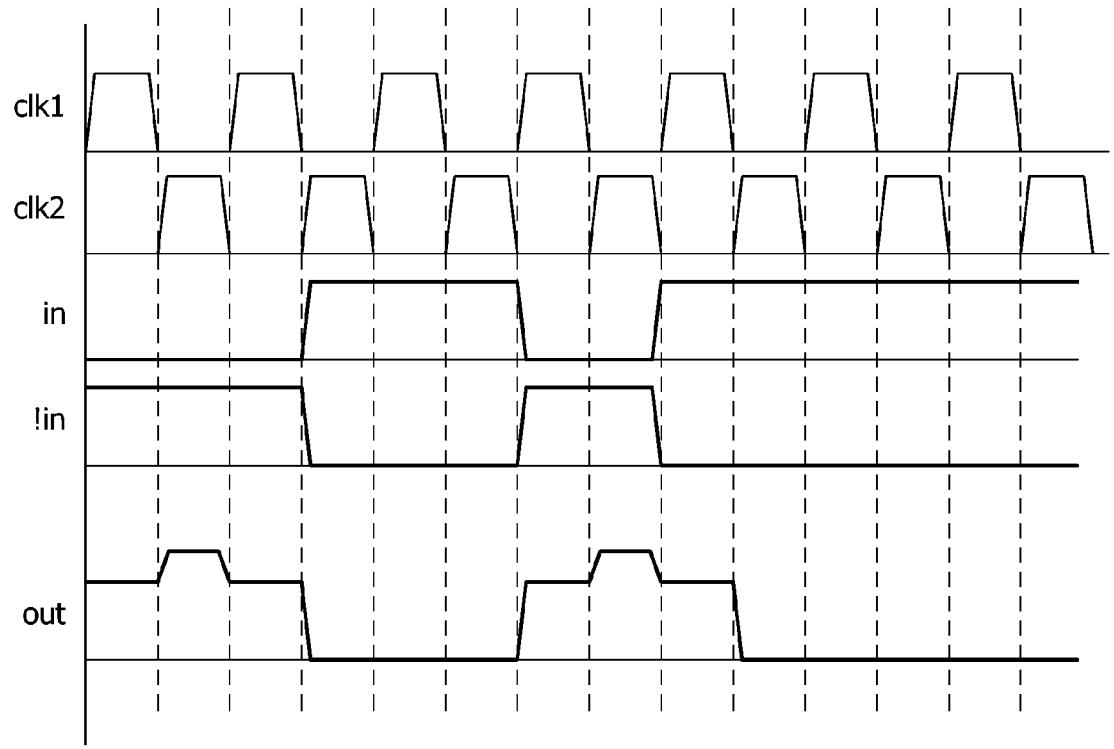
Figure 8:
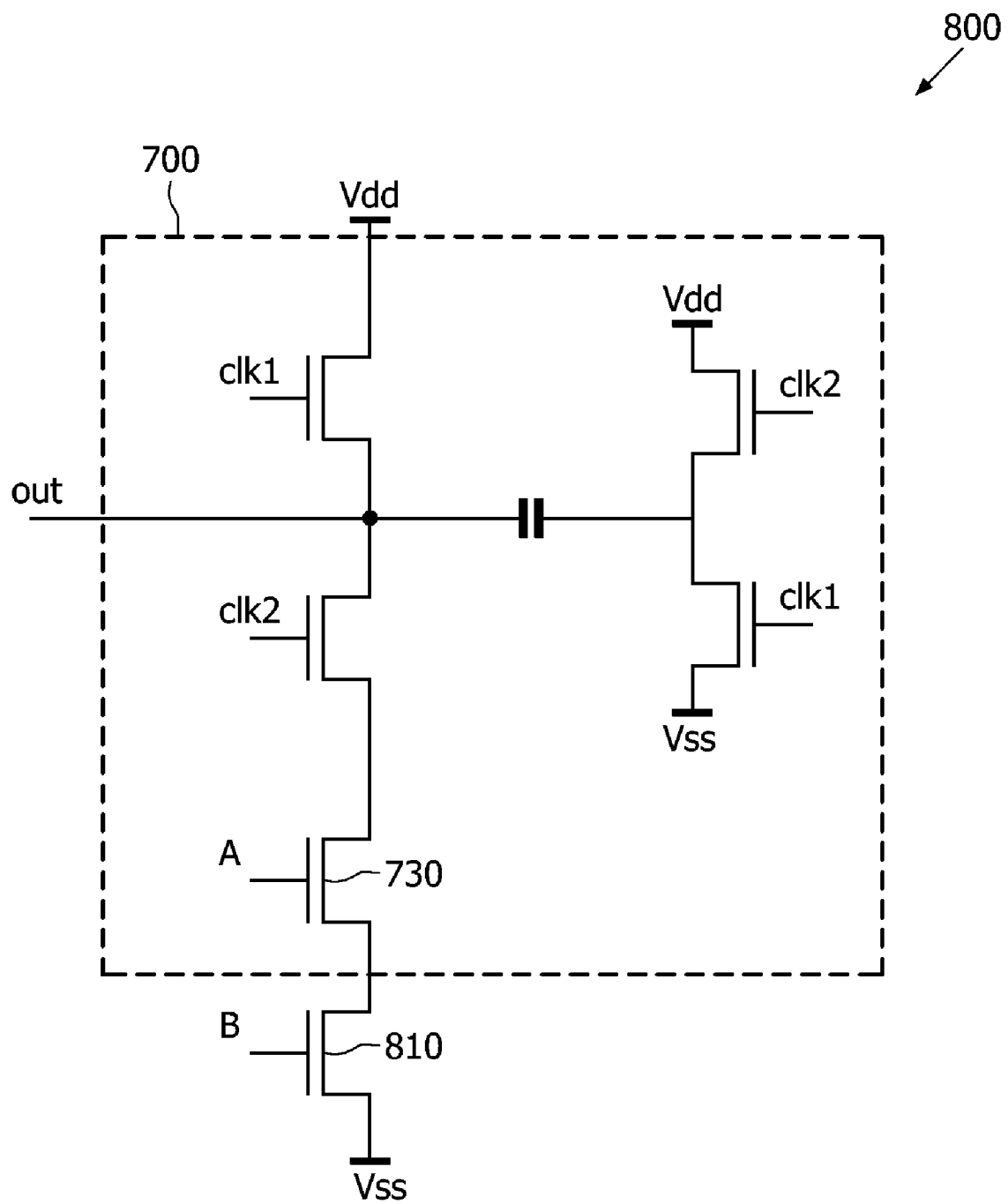
Figure 9:
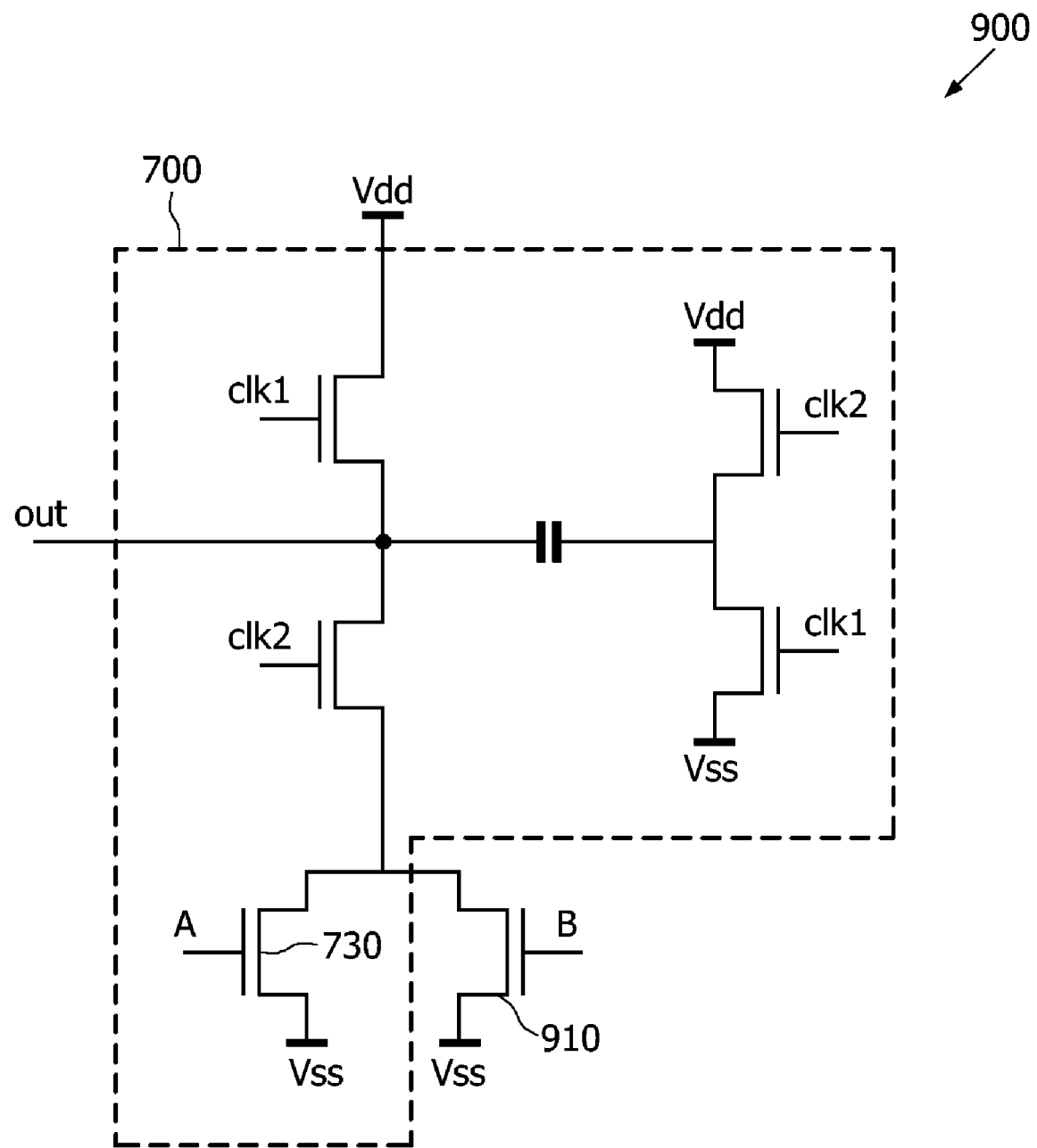
Figure 11:
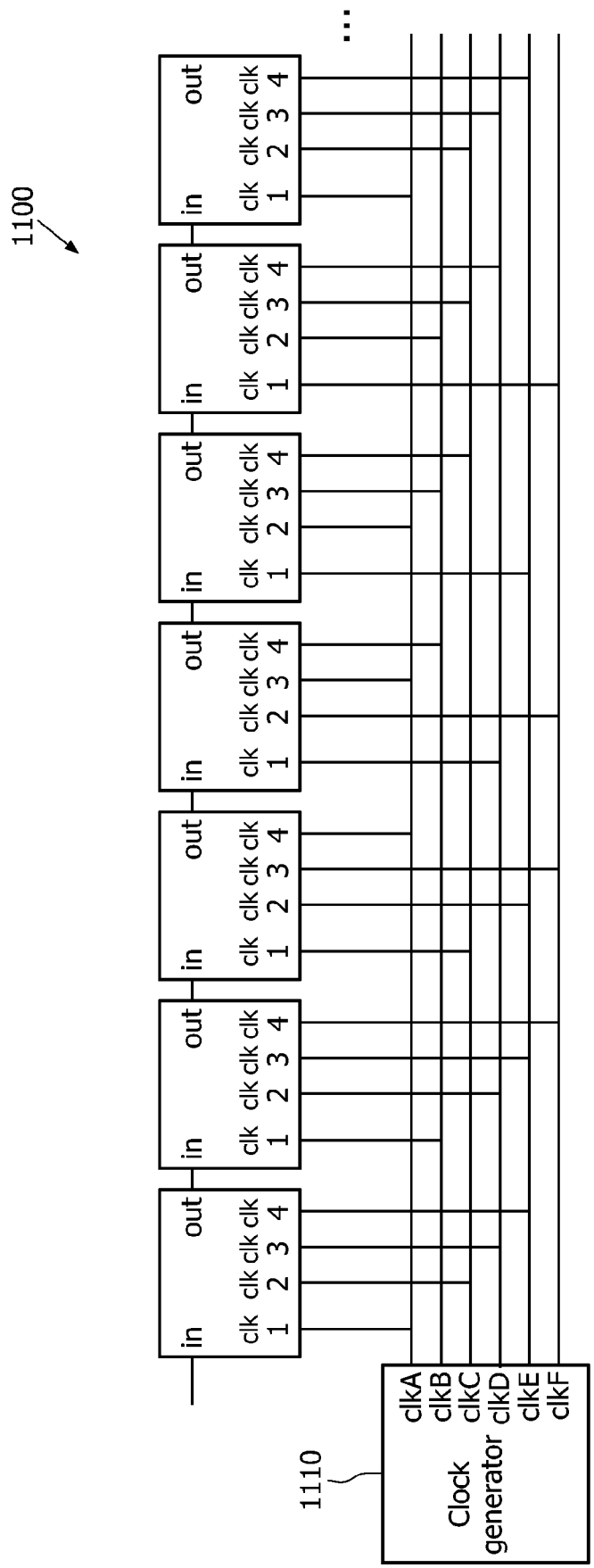
Figure 12:
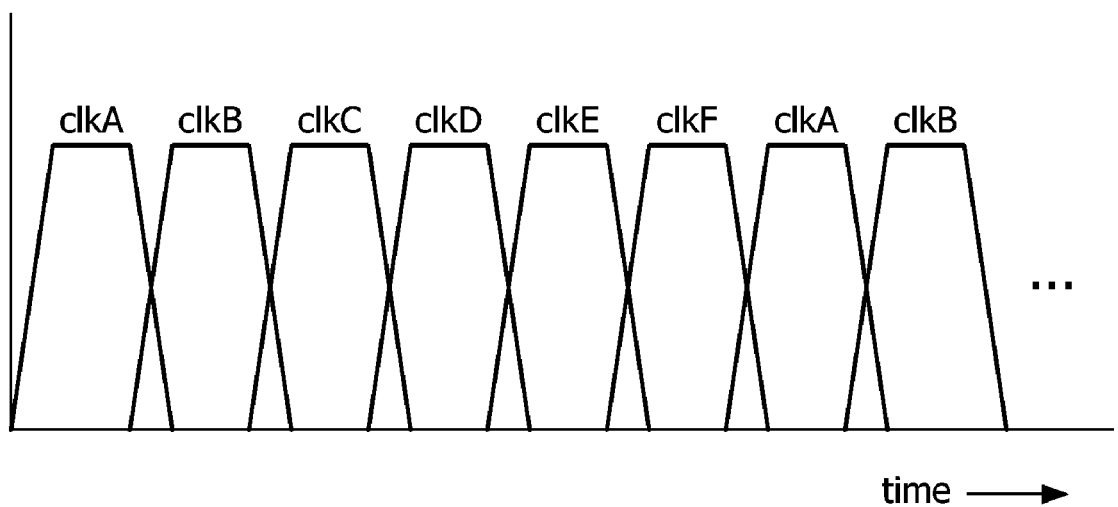
Figure 13:
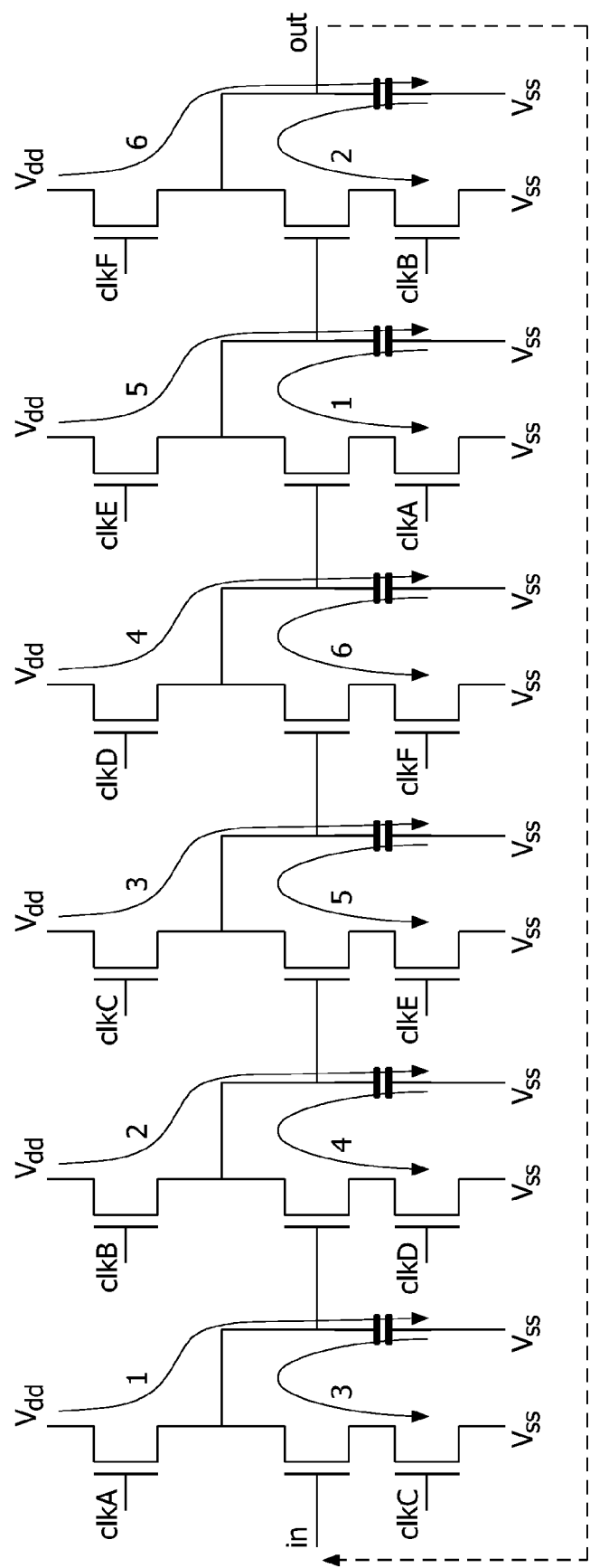

These and other aspects of the invention are described in more detail with reference to the drawing. Therein, FIG. 1 shows a standard CMOS inverter circuit, FIG. 2 shows a standard circuit for single conductivity type inverter, using depletion transistor as load device, FIG. 3 shows a single conductivity and single threshold type inverter, using transistor in diode connection mode, FIG. 4 is block diagram of a single threshold and single conductivity type logic according to the present invention, FIG. 5 shows a single conductivity and single threshold type inverter according to this invention, FIG. 5(*a*) shows a single conductivity and single threshold type NAND logic according to this invention, FIG. 5(b) shows a single conductivity and single threshold type NOR logic according to this invention, FIG. 6 shows a single conductivity and single threshold type inverter according to the present invention and bootstrapping circuit, FIG. 6 (a) shows timing diagram logic states of inverter of FIG. 6, FIG. 7 shows another embodiment of the inverter according to the present invention, having a bootstrapping circuit and a capacitor at output of inverter, FIG. 7 (a) shows timing diagram logic states of inverter of FIG. 7, FIG. 7(b) shows another embodiment of the inverter according to the present invention, having a bootstrapping circuit and a capacitor at output of inverter, FIG. 7 (c) shows timing diagram logic states of inverter of FIG. 7(b), FIG. 8 shows an embodiment of the NAND logic according to the present invention, having a bootstrapping circuit and a capacitor at the output, FIG. 8(a) shows another embodiment of the NAND logic according to the present invention, having a bootstrapping circuit and a capacitor at the output, FIG. 8 (b) shows timing diagram logic states of NAND logic of FIG. 8(a), FIG. 9 shows an embodiment of the NOR logic according to the present invention, having a bootstrapping circuit and a capacitor at the output, FIG. 9(a) shows an embodiment of the NOR logic according to the present invention, having a bootstrapping circuit and a capacitor at the output, FIG. 9 (b) shows timing diagram logic states of NOR logic of FIG. 9(a), FIG. 10 (a) shows an embodiment of the inverter logic according to the present invention, enabling synchronization, FIG. 10 (b) shows an embodiment of the NAND logic according to the present invention, enabling synchronization, FIG. 10 (c) shows an embodiment of the NOR logic according to the present invention, enabling synchronization, FIG. 11 shows general synchronization architecture for synchronizing the logic of instant invention, FIG. 12 shows characteristics of clock signals used in one of the possible synchronization architecture FIG. 13 shows a synchronized series of inverters forming a shift register.

Figure 4:
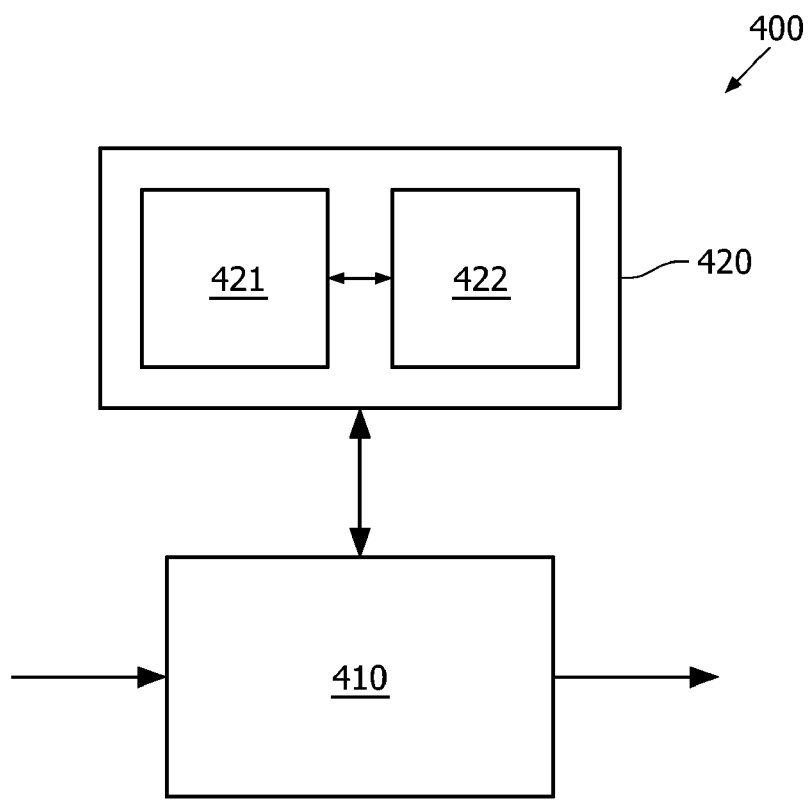

Reference is now made to FIG. 4, wherein a block diagram of a single threshold and single conductivity type logic assembly 400 according to the present invention is shown. The logic assembly 400 has an output driving circuit 420 for driving output of logic assembly 400 coupled to a logic circuitry 410. The logic circuitry 410 comprises at least a set of switches each having a main current path and a control terminal. The main current path forms a series arrangement with first and second conducting terminals of said main current path. The conducting terminals are coupled to power supply lines directly or through logic elements. Common terminals of said set of switches provide an output of logic assembly 400. Control terminals of said switches are coupled to clock circuitry providing mutually non-overlapping clock signals to said control terminal. The driving circuit 420 is coupled to the logic circuitry 410 and is arranged for driving the output of said logic assembly 400 by enabling an additional supply of charge thereto. The driving circuit 420 comprises a capacitive means 421 and a bootstrapping circuit 422 that enables an additional supply of charge to a first end of said capacitive means 421, resulting in an increased voltage at a second end of said capacitive means, and hence, an increased supply of charge to the logic circuit 410 which results in a rail-to-rail output of said logic assembly 400. Additional circuitry may be added to the conducting terminals set of transistors for realizing different logic gates. In the following description, an inverter, NAND and NOR gates constructions are discussed in detail. A person skilled in art will appreciate other logic gates e.g. AND, OR etc. can be constructed based on the same concept.

Figure 5:
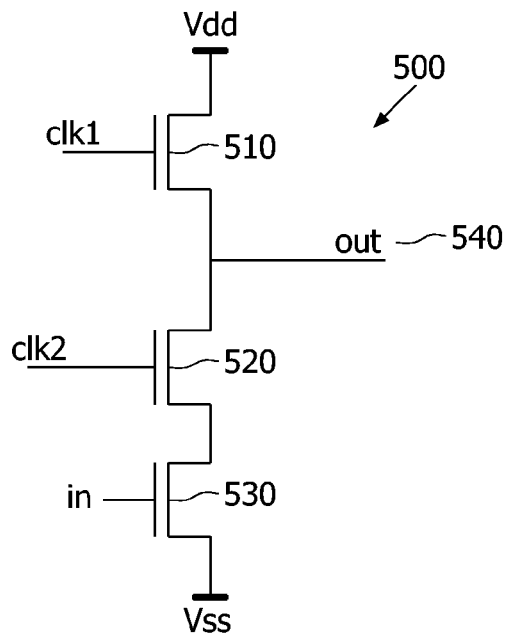
Figure 5A:
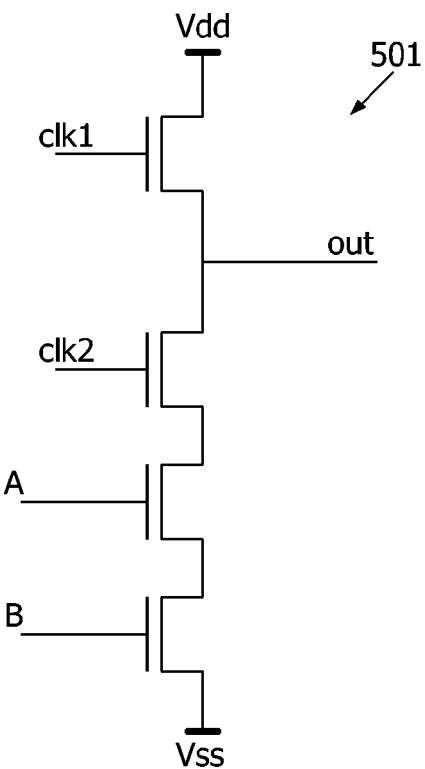
Figure 5B:
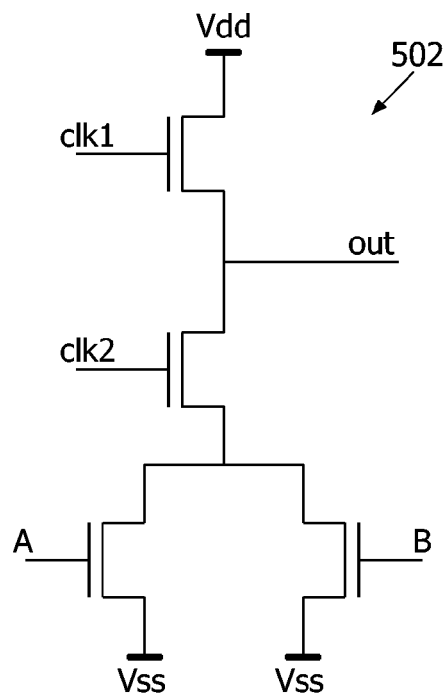

Reference is now made to FIG. 5. FIG. 5 is one of the possible embodiments of an inverter 500 according to present invention that may be included in the logic circuit block 410 of FIG. 4. In this circuit only NMOS transistors are used to realize inverter 500. Each transistor is a similar transistor having same characteristics (threshold voltage etc.). According to the invention the inverter is provided with serially coupled transistors 510, 520, and 530, the transistors 510, and 520 receiving mutually non-overlapping clocks clk1 and clk2, at their control terminals respectively. An output 540 of inverter is formed by common terminals to which the current paths of the said serially connected transistors 510, 520 are coupled, as shown in the figure. In this configuration the maximum voltage provided at the output 540 of the inverter 500 will be at $V_{dd}-V_T$. To ensure a rail-to-rail output, a capacitive means (not shown) is coupled to the inverter. A bootstrapping circuit (not shown) is also provided to enable supply of voltage from one end to another end of the capacitive means. Similarly FIG. 5(a) and FIG. 5(b) shows a NAND 501 and NOR 502 logic that may be included in logic circuit 410 of FIG. 4. On the same line other logic gates e.g. AND, OR etc. may be also constructed. Operation of these circuit and, role of the bootstrapping circuit and capacitive means, will become clearer in subsequent description.

Figure 6:
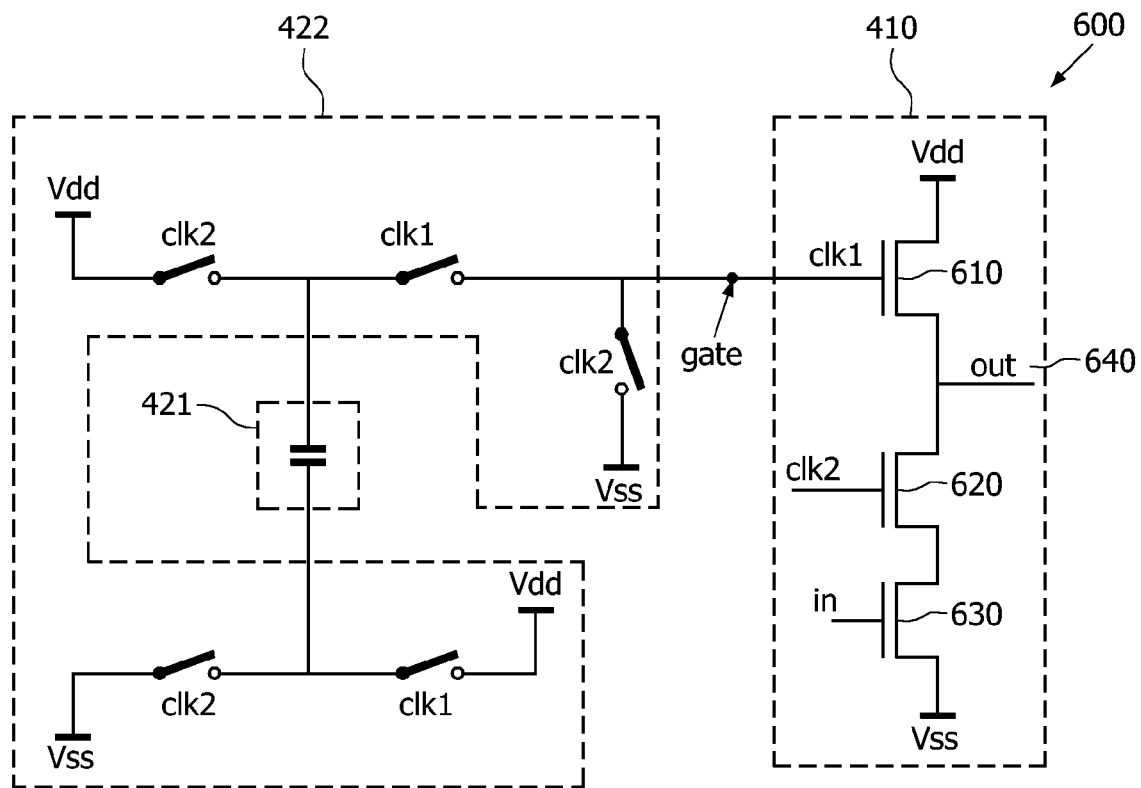
Figure 6A:
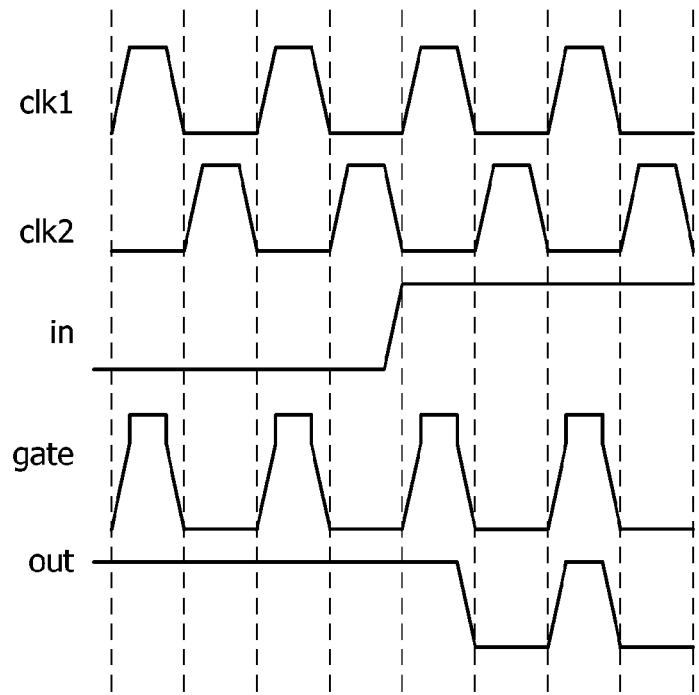

Reference is now made to FIG. 6 and FIG. 6(a), which shows a detailed diagram of inverter 600, having a bootstrapping circuit 422, capacitive means 421, logic 410, as shown in FIG. 5 and an associated timing diagram respectively. Operation of the circuit may be understood as follows. According to the inverter characteristics, for a low input the output is expected high and vise-versa. Consider a case when the mutually non-overlapping clock signals clk1 is high, clk2 is low and the input in is low. In this case transistor 610 is enabled and transistor 620 is disabled. (refer, timing diagram shown in FIG. 6(a)). This will charge the output 640 up to $V_{dd}-V_T$. Further, the bootstrapping circuit 422 at this time couples one terminal of the capacitive means 421 to the control terminal of transistor 610 and the other terminal of the capacitive means 421 to $V_{dd}$, which supplies an extra charge at the control terminal of the transistor 610 (refer, timing diagram for gate shown in FIG. 6(a)). Consequently transistor 610 is completely enabled, so that the output 640 provides a rail-to-rail output voltage. In the second half of the clock cycle when clk1 is low and clk2 is high the capacitive means 421 is coupled to $V_{ss}$ and $V_{dd}$ such that it is charged. In this case clock signal clk1 is low and clk2 is high therefore transistor 610 is disabled, and the output 640 of the inverter is left floating. A person skilled in the art will appreciate that an inherent parasitic capacitances keeps the floating inverter output 640 at high level. Consequently a high inverter output 640, equal to the supply voltage Vdd is provided, as shown in the timing diagram (FIG. 6(a)).

Further consider the case wherein the input signal is high. In a first clock phase the clock signal clk1 is low and clk2 is high. In that case transistor 610 is disabled and, transistor 620 and a high input in enables transistor 630, Therefore, output 640 of the inverter, provides a low output voltage, which is desirable. In this case the capacitive means 421 is connected to $V_{ss}$ and $V_{dd}$ such that it gets charged. However, in a subsequent clock phase the mutually non-overlapping clock signals assume the values clk1: high and clk2: low. This combination of clock signal values enables transistor 610 and disables transistor 620 and input is high (refer, timing diagram). This will charge the output 640 up to $V_{dd}-V_T$. Further, the bootstrapping circuit 422 at this time couples capacitive means 421 to the control terminal of transistor 610 and $V_{dd}$ which supplies an extra charge to control terminal of transistor 610 (refer, timing diagram for gate shown in FIG. 6(*a*)) opening this transistor 610 completely, therefore raising output to high voltage, which is not desirable as according to the inverter characteristics, therefore, providing an invalid output 640 of the inverter. A person skilled in the art will appreciate that synchronizing cascaded circuits for valid outputs for given clock is very common and may be achieved by any available synchronizing techniques, however for the purpose of clarity one of the possible synchronizing technique will be explained in detail in the subsequent discussion. Furthermore a person skilled in the art will also appreciate that the concept depicted in FIG. 6 may be further extended to realize embodiments for NAND, NOR (shown in FIG. 5 (*a*), FIG. 5(*b*)) or any other logic gates.

Reference is now made to FIG. 7, which shows another embodiment of the inverter 700 according to the present invention. In this embodiment the capacitive means 421 is coupled to the output of the logic 410 at a first end and to the bootstrapping circuit 422 at another end. Consider a state wherein the mutually non-overlapping clock signals clk1 and clk2 are high and low respectively. This enables transistor 710 and disables transistor 720. Suppose further that the signal at the input of the control terminal of the transistor 730 is low (refer, timing diagram shown in FIG. 7(*a*)). This will charge the output 740 up to $V_{dd}-V_T$. Further; the bootstrapping circuit 422 at this time couples one end of the capacitive means 421 to $V_{ss}$, charging and maintaining the output 740 of inverter at a value $V_{dd}-V_T$. In the second half of the cycle when clk1 is low and clk2 is high transistor 710 is disabled and one end of the capacitive means 421 is connected to $V_{dd}$ pumping additional charge into the inverter output 740, thereby providing a desirable high voltage output.

Now consider a state wherein the input signal provided at input in is high. Further consider a first clock phase, wherein clock signal clk1 is low and clk2 is high. In that case transistor 710 is disabled, and transistor 720 and a high input enables transistor 730. Consequently, the voltage at the output 740 of the inverter is low (Vss) which is desirable. In this case the capacitive means 421 is connected to $V_{ss}$ and $V_{dd}$ such that it gets charged. However, in the next clock phase, the mutually non-overlapping clock signals clk1 (high) and clk2 (low) enable transistor 710 and disable transistor 720. As the input at the control terminal of the transistor 730 is still high (refer, timing diagram shown in FIG. 7(*a*)) the output 740 is charged up to $V_{dd}-V_T$. Further, the bootstrapping circuit 422 at this time couples capacitive means 421 at one side to the lower supply voltage $V_{ss}$ which maintains the output 740 at high, hence providing an invalid output of the inverter.

It is to be noted that a valid output is provided only during the phase wherein the clock signal clk2 high. As mentioned earlier a circuit further processing the output signal may be synchronized so that the output signal is only received in the clock phase wherein clock signal clk2 is high and clk1 low.

Hereinafter, embodiments, with capacitive means and bootstrapping circuit at output of logic, are discussed for sake of clarity. However, a person skilled in the art will appreciate that embodiments with capacitive means and bootstrapping circuit at input are also possible (as described in FIG. 6) and are within the scope of this invention.

Reference is now made to FIG. 7(*b*), which shows another possible embodiment of an inverter 701 that advantageously provides a substantially stable output signal. In the embodiment, the inverter 700 of FIG. 7 is provided with an additional transistor 711 receiving an inverted input !in as shown in FIG. 7(*b*). Referring to the associated timing diagram (shown in FIG. 7(*c*)) it may be noted that the output does not react instantaneously to changes on the input in. In this embodiment synchronizing falling edges of the input to falling edges on clk1 and synchronizing rising edges of the input to falling edges on clk2, will result in a logic that would provide always-valid output.

Reference is now made to FIG. 8, which shows one of the possible embodiments of NAND logic 800. Therein an additional transistor 810 is provided in series to the inverter 700 as shown in FIG. 7 and the control terminals of input transistors 730 and 810 serve as the inputs of the NAND gate.

Reference is now made to FIG. 8(*a*), which shows another possible embodiment of the NAND logic 801 that may be realized by coupling a set of transistors 811 and 812 to the NAND gate 800 of FIG. 8. In addition FIG. 8(*b*) shows timing diagram associated with this embodiment. The control terminals of transistors 811 and 812 are connected to inverted inputs. All logic states of this circuit are depicted in the timing diagram.

Reference is now made to FIG. 9, which shows one of the possible embodiments of NOR logic 900. An additional transistor 910 is arranged in parallel to the transistor 730 of the inverter 700 shown in FIG. 7. The control terminals of input transistors 730 and 910 serve as the inputs of the NOR gate.

Reference is now made to FIG. 9(*a*) and FIG. 9(*b*) which show another possible embodiment of the NOR logic 901 and associated timing diagram respectively, that may be realized by coupling a set of transistors 911 and 912 to the NOR gate 900 of FIG. 9. The control terminals of transistors 911 and 912 are connected to inverted inputs. All logic states of this circuit are depicted in the timing diagram shown in FIG. 9(*b*).

Similarly other logic gates AND, OR etc. may be constructed. Also it is to be noted that embodiments of logic gates with bootstrapping and capacitive means at input as discussed under FIG. 6 may also be constructed.

In subsequent discussion, synchronization architecture and logic circuits that would enable synchronization of cascaded logics will be discussed. Synchronization may be achieved using two, three, four or more clocks. A synchronization technique is discussed using six clocks.

Reference is now made to FIGS. 10(*a*), 10(*b*) and 10(*c*) which depicts embodiments of an inverter, NAND and NOR logic gate that enable synchronization using six clock signals. In these figures parts corresponding to those in FIG. 4 have the same reference numbers. In this embodiments the capacitive means 421 are realized by shorting conductive terminals of transistors 1051 and 1052. The bootstrapping circuit has been provided with additional transistors 1061 and 1062 receiving clock signals at their control terminals. For clarity FIG. 10(*a*) is being discussed in detail in following discussion.

Figure 10A:
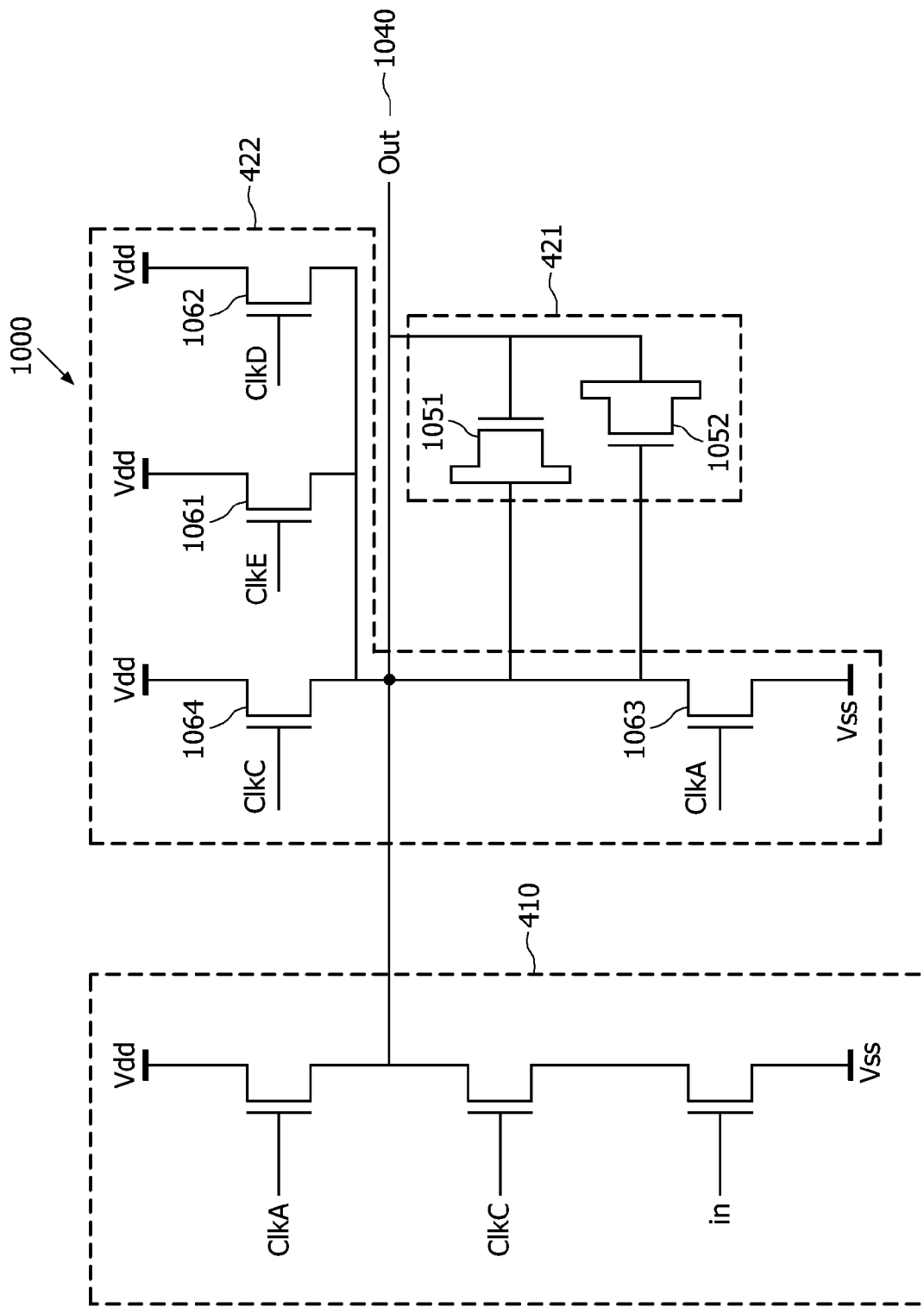
Figure 10B:
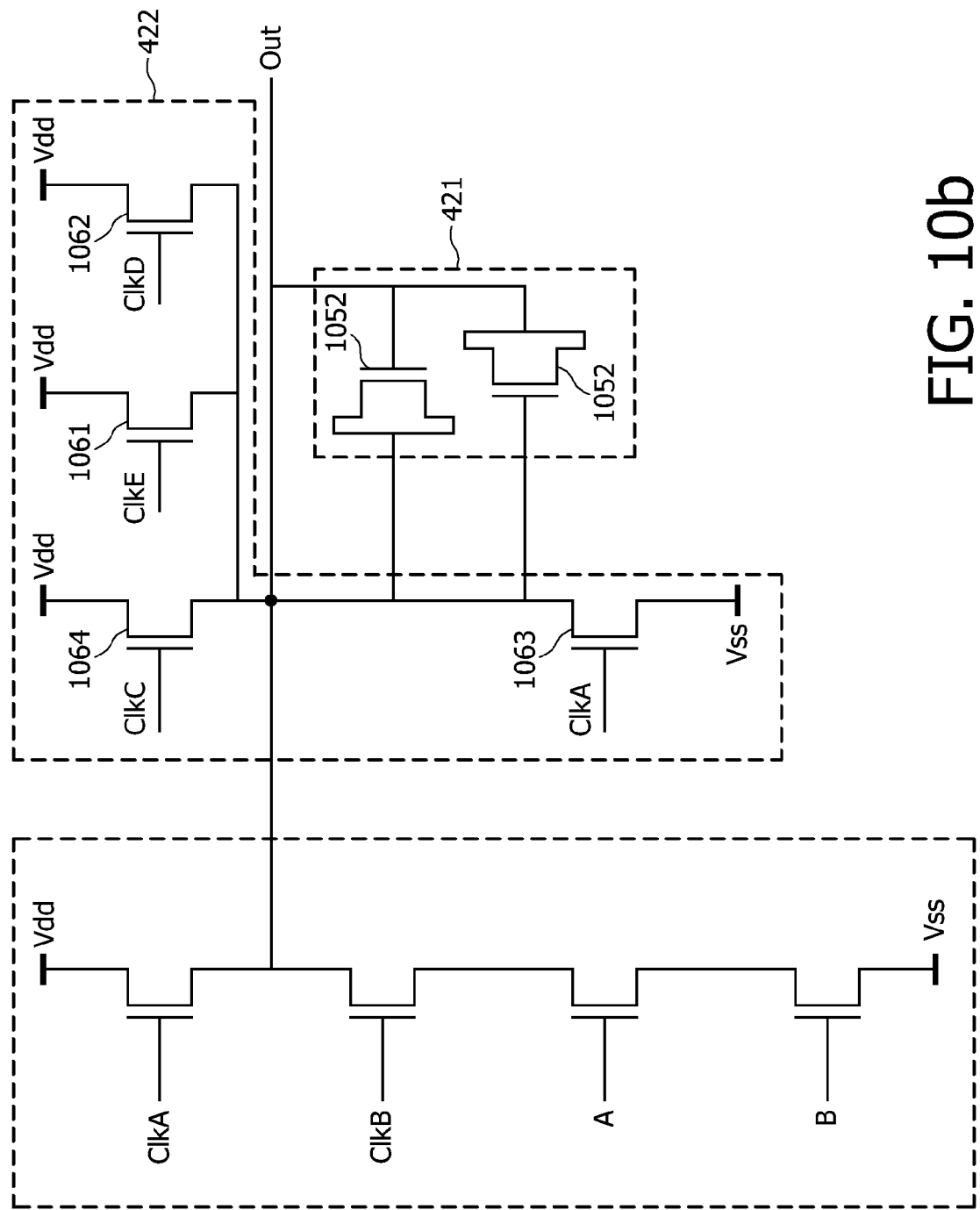
Figure 10C:
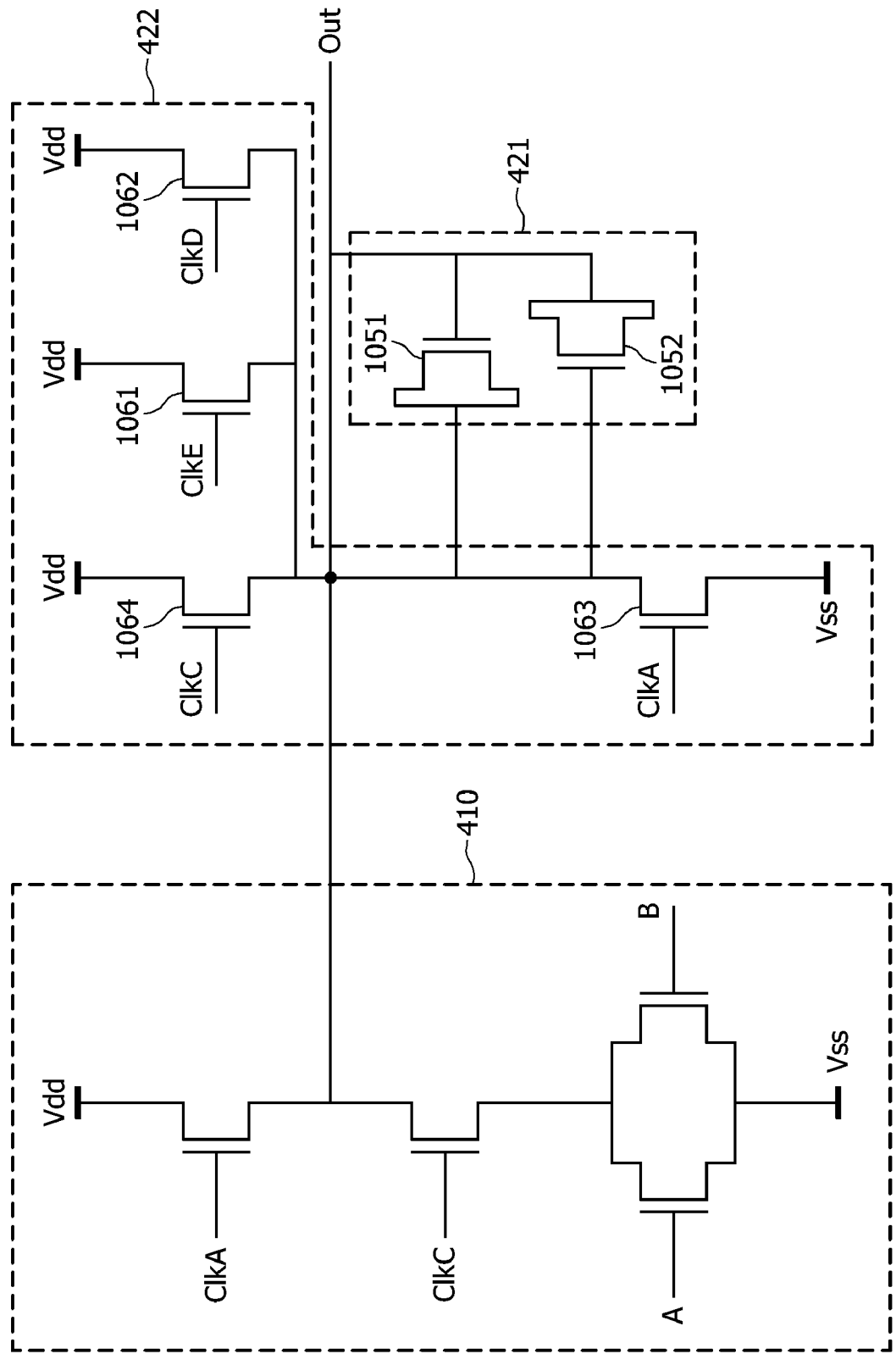

Reference is now made to FIG. 10(*a*), which shows an embodiment of an inverter 1000 that enables synchronization. The block 410 forms a basic dynamic logic inverter as described in FIG. 5, receiving clock signals clkA and clkC. The capacitive means 421 are realized using transistors 1051 and 1052 by shorting their conducting terminals, however the capacitive means may also be realized using a single transistor also. Transistors 1051 and 1052 with shorted conducting terminals are connected anti-parallel to each other for improving capacitive behavior, at both rising and falling edge of the inverter output 1040. Optionally the sizes of the 1051 and 1052 may also be altered for improving the capacitive effect. Bootstrapping block 422 is provided with transistors 1061, 1062, 1063 and 1064. Additional transistors 1061 and 1062 are provided to keep the output above $V_{dd}$ when clkE or clkD is high. Operation of the inverter is same as discussed earlier for FIG. 7 except the fact that those additional transistors 1061 and 1062 keep the output of the inverter at a high level when clkD and clkE are at a high level. Depending on the details of the technology, it may be necessary to change the sizing, to add extra cascode transistors for avoidance of leakage or breakdown, to apply a capacitive feedback to the input or make other modifications. The description of FIG. 10a applies analogously to the NAND logic circuit of FIG. 10(b) and to the NOR logic circuit of FIG. 10(c).

Cascading of multiple logic circuits will be clear from following description.

For that purpose reference is now made to FIG. 11, which shows a general synchronization architecture 1100 that may be used for synchronizing the logic of instant invention. A general logic of the instant invention may be synchronized using 6 mutually partially overlapping clock signals namely; clkA, clkB, clkC, clkD, clkE and clkF. The clock signal characteristics are shown in FIG. 12. In this example of synchronization architecture 1100, a series of seven logic assemblies according to present invention are shown and each logic assembly receives at least four clock signals. The synchronization architecture 1100, further has a clock signal generator 1110 that generates clocks signals clkA, clkB, clkC, clkD, clkE and clkF. The first clock signal ClkA has a high level during the first 60° of the clock cycle, the second clock signal ClkB is shifted in phase with 60° with respect to clock signal ClkB, the third clock signal ClkC is shifted in phase with 120° with respect to the first clock signal ClkA etc. Each logic assembly is connected to an alternate set of clock signals as shown in FIG. 11, so that the clock signals clk1, clk2, clk3, clk4 received by each logic assembly are respectively 60° ahead in phase with respect to the clock signals clk1, clk2, clk3, clk4 received by its preceding logic assembly. A person in the art will appreciate that the invention may also be carried out for phase differences other than 60°. It is to be noted that clock signal connection of first and seventh logic assembly are the same and similarly, clock signal connection of second and eighth, third and ninth, and so on. The nature of the selected clock signal pattern, and the alternate connection of the clock signals, ensures that input of a logic assembly is enabled at a clock signal only when the output of the preceding logic assembly in the series provides a valid output.

In this example the first logic assembly from the left is connected to clock signals clkA, clkC, clkD and clkE and the following logic assembly is connected to clkB, clkD, clkE and clkF and so on. Therefore the first logic assembly provides a valid output when clkB clock signal is high and the following logic assembly samples the input only when the clock signal clkB is high thereby ensuring a valid input for the following logic assembly. Likewise the subsequent logic assemblies sample their input signals at the right moment in time. The process of synchronization is illustrated in FIG. 13.

FIG. 13 illustrates a synchronized series of inverters forming a shift register. It is to be noted that in a given inverter top and bottom transistors receive alternate clock signals, all top transistors receive consecutive clock signals and similarly all bottom transistor receive consecutive clock signals in a cyclic manner. Further, for simplicity and clarity the bootstrapping circuit is not shown in the figure, however, each inverter will have a bootstrapping circuit coupled to the capacitive means. The operation of this embodiment is explained below.

Capacitors of each inverter are charged sequentially from first to sixth clock signal, i.e. first capacitor is charged during first phase (high) of clock signal clkA, and second capacitor is charged during clock signal clkB and so on as shown in figure. The capacitors remains charged during subsequent clock signal i.e. first capacitor remains charged until clkB is high and second during clock signal clkC is high and so on. Further the capacitors are discharged in the subsequent clock signals i.e. first capacitor will discharge when clock signal clkC is high and second capacitor will discharge when clkD is high and so on. It is to be noted that an input is received by an inverter only when the previous capacitor is fully charged e.g. the second inverter receives the input from the first only during the high phase of clock signal clkB when the capacitor of the first inverter is fully charged, similarly the third inverter receives its input during clkC and so on. This arrangement ensures receipt of only valid inputs at each inverter, thereby realizing a shift register operation.

Effectively, each capacitor is pre-charged in the first step of the clock cycle. In the second step of the clock cycle the capacitor holds the charge and provides a boost to the output. In the third step the capacitors discharges.

It should also be noted that the same operation may be achieved using 5 overlapping clocks signals or 4 non-overlapping clock signals. In addition other synchronization techniques are possible.

The synchronizing architecture may be constructed for complicated cascaded logics, including flip-flops, latches, shift registers etc.

In the above discussion logic using N-conductivity type elements are explained, a person skilled in the art will appreciate that logic using P-conductivity type elements may also be explained analogously.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of software by means of a suitably programmed computer. In the system claims enumerating several means, several of these means can be embodied by one and the same item of computer readable software or hardware.

The invention claimed is:

1. A logic assembly comprising:
   a logic circuit comprising a plurality of switches of a single threshold and a single conductivity type, wherein the switches comprise:
   a first switch having a main current path and a control terminal, wherein a first end of the main current path of the first switch is coupled to a first power supply line, a second end of the main current path of the first switch is directly coupled to an output node of the logic circuit, and the control terminal of the first switch is coupled to clock circuitry to receive a first clock signal;
   a second switch having a main current path and a control terminal, wherein a first end of the main current path of the second switch is directly coupled to the output node of the logic circuit, a second end of the main current path of the second switch is coupled to a second power supply line, and the control terminal of the second switch is coupled to the clock circuitry to receive a second clock signal, wherein the first and second clock signals are mutually non-overlapping clock signals;

an output boosting circuit coupled to the logic circuit, wherein the output boosting circuit comprises circuit elements of the single threshold and the single conductivity type to boost an output signal of the logic circuit, wherein the output boosting circuit comprises:

a capacitive means for enabling supply of an additional charge to the output signal of the logic circuit; and a bootstrapping circuit coupled to the capacitive means, the bootstrapping circuit to enable an additional supply of charge to a first end of the capacitive means to generate a boosted voltage at a second end of the capacitive means.

2. A logic assembly as claimed in claim 1, wherein the output node of the logic circuit directly between the first and second switches forms a common output node of the logic assembly.

3. A logic assembly as claimed in claim 1, wherein the output boosting circuit is coupled to one of the control terminals of the first and second switches of the logic circuit.

4. A logic assembly as claimed in claim 1, wherein the output boosting circuit is coupled to the output node of the logic circuit.

5. A logic assembly as claimed in claim 1, wherein the first and second switches comprise metal-oxide semiconductor field-effect transistor (MOSFET) switches.

6. A logic assembly as claimed in claim 5, wherein the first and second switches comprise NMOS transistors.

7. A logic assembly as claimed in claim 1, further comprising:

a third switch having a main current path and a control terminal, wherein the third switch is coupled between the second switch and the second power supply line, wherein a first end of the main current path of the third switch is directly coupled to the second end of the main current path of the second switch, a second end of the main current path of the third switch is directly coupled to the second power supply line, and the control terminal of the third switch is coupled to an input node to receive an input signal.

8. A logic assembly as claimed in claim 1, wherein said bootstrapping circuit receives a plurality of clock signals for synchronization of a plurality of cascaded logic assemblies.

* * * * *